United States Patent
Lee et al.

(10) Patent No.: US 11,322,673 B2
(45) Date of Patent: May 3, 2022

(54) THERMOELECTRIC MODULE AND TEMPERATURE MODULATING APPARATUS INCLUDING THE SAME

(71) Applicants: HYUNDAI MOTOR COMPANY, Seoul (KR); KIA MOTORS CORPORATION, Seoul (KR)

(72) Inventors: Hoo Dam Lee, Seongnam-si (KR); Byung Wook Kim, Seongnam-si (KR); Woo Ju Lee, Sejong-si (KR); Jin Woo Kwak, Suwon-si (KR)

(73) Assignees: HYUNDAI MOTOR COMPANY, Seoul (KR); KIA MOTORS CORPORATION, Seoul (KR)

(*) Notice: Subject to any disclaimer, the term of this patent is extended or adjusted under 35 U.S.C. 154(b) by 596 days.

(21) Appl. No.: 16/267,609

(22) Filed: Feb. 5, 2019

(65) Prior Publication Data

US 2020/0176660 A1   Jun. 4, 2020

(30) Foreign Application Priority Data

Dec. 4, 2018 (KR) .......................... 10-2018-0154725

(51) Int. Cl.
 *H01L 35/32* (2006.01)
 *H01L 35/10* (2006.01)

(52) U.S. Cl.
 CPC .............. *H01L 35/32* (2013.01); *H01L 35/10* (2013.01)

(58) Field of Classification Search
 CPC .................................. H01L 35/10; H01L 35/32
 See application file for complete search history.

(56) References Cited

U.S. PATENT DOCUMENTS

| | | | | |
|---|---|---|---|---|
| 2008/0236643 A1* | 10/2008 | Li | .......................... | H01L 35/32 136/203 |
| 2010/0218512 A1* | 9/2010 | Alahyari | ................. | F25B 21/02 62/3.3 |
| 2014/0096810 A1* | 4/2014 | Nakamura | .............. | H01L 37/00 136/205 |
| 2014/0230875 A1* | 8/2014 | Angermann | ............ | H01L 35/28 136/230 |
| 2015/0243870 A1* | 8/2015 | Kushch | ..................... | F24B 1/26 136/211 |
| 2017/0194550 A1* | 7/2017 | Mascolo | ................. | H01L 35/32 |
| 2018/0090658 A1* | 3/2018 | Kasahara | ................ | H01L 35/10 |
| 2018/0366631 A1* | 12/2018 | Chikagawa | ............. | H01L 35/34 |

* cited by examiner

*Primary Examiner* — Bethany L Martin
(74) *Attorney, Agent, or Firm* — McDonnell Boehnen Hulbert & Berghoff LLP

(57) ABSTRACT

A thermoelectric module includes a flexible film with an insulation characteristic, the film having a shape that is longer in a lengthwise direction than in a width direction, a plurality of n-type thermoelectric elements and a plurality of p-type thermoelectric elements alternately arranged on one surface of the film in the lengthwise direction of the film, and first electrodes and second electrodes that alternately connect the plurality of n-type thermoelectric elements and the plurality of p-type thermoelectric elements at one side and an opposite side with respect to the width direction of the film to electrically connect the plurality of n-type thermoelectric elements and the plurality of p-type thermoelectric elements in series. One lateral end and an opposite lateral end of the film are bent with the plurality of n-type thermoelectric elements, the plurality of p-type thermoelectric elements, the first electrodes, and the second electrodes attached to the film.

14 Claims, 5 Drawing Sheets

THERMOELECTRIC MODULE AND TEMPERATURE MODULATING APPARATUS INCLUDING THE SAME

CROSS-REFERENCE TO RELATED APPLICATION

This application is claims the benefit of priority to Korean Patent Application No. 10-2018-0154725, filed in the Korean Intellectual Property Office on Dec. 4, 2018, the entire contents of which are incorporated herein by reference.

TECHNICAL FIELD

The present disclosure relates to a thermoelectric module and a temperature modulating apparatus including the same.

BACKGROUND

A thermoelectric module is used in a thermoelectric generator system using the Seebeck effect of generating an electromotive force by using a temperature difference on both sides.

During thermoelectric power generation by the thermoelectric module, the output of the thermoelectric power generation may be increased by maintaining a significant temperature difference between a hot side and a cool side. In this case, the heat transfer rate from a heat source to the thermoelectric module has a great effect on the output of the thermoelectric power generation.

In general, a thermoelectric module is manufactured by forming n-type and p-type thermoelectric elements and electrodes on a ceramic substrate. However, the thermoelectric elements may be easily separated from the ceramic substrate because the ceramic substrate is very brittle and interfaces between the substrate and the thermoelectric elements are unstable.

To solve this problem, a film type thermoelectric module with thermoelectric elements and electrodes formed on a flexible film is considered in the related art. However, due to the small thickness of the film type thermoelectric module, it is difficult to make a temperature difference, and the film type thermoelectric module has low durability.

SUMMARY

The present disclosure has been made to solve the above-mentioned problems occurring in the prior art while advantages achieved by the prior art are maintained intact.

An aspect of the present disclosure provides an improved film type thermoelectric module for overcoming the shortcomings of the above-described film type thermoelectric module.

Another aspect of the present disclosure provides a thermoelectric module that has flexibility and is structurally stable, compared with the conventional thermoelectric module including the ceramic substrate.

The technical problems to be solved by the present inventive concept are not limited to the aforementioned problems, and any other technical problems not mentioned herein will be clearly understood from the following description by those skilled in the art to which the present disclosure pertains.

According to an aspect of the present disclosure, a thermoelectric module includes a flexible film with an insulation characteristic, the film having a shape that is longer in a lengthwise direction than in a width direction, a plurality of n-type thermoelectric elements and a plurality of p-type thermoelectric elements alternately arranged on one surface of the film in the lengthwise direction of the film, and first electrodes and second electrodes that alternately connect the plurality of n-type thermoelectric elements and the plurality of p-type thermoelectric elements at one side and an opposite side with respect to the width direction of the film to electrically couple the plurality of n-type thermoelectric elements and the plurality of p-type thermoelectric elements in series.

One lateral end and an opposite lateral end of the film are bent with the plurality of n-type thermoelectric elements, the plurality of p-type thermoelectric elements, the first electrodes, and the second electrodes attached to the film, such that the widest surfaces of the first electrodes and the widest surfaces of the second electrodes face the one side and the opposite side with respect to the width direction of the film, respectively.

According to another aspect of the present disclosure, a temperature modulating apparatus including a thermoelectric module includes a cover layer exposed to the outside, a support with an insulation characteristic, wherein the support has an upper surface adhering to the cover layer, and the thermoelectric module is inserted into the support, and a heat dissipation foam adhering to a lower surface of the support, the heat dissipation foam being formed of a material with higher thermal conductivity than the support.

The thermoelectric module includes a flexible film with an insulation characteristic, the film having a shape that has a width in a direction in which the cover layer, the support, and the heat dissipation foam are stacked and is longer in a lengthwise direction than in a width direction, a plurality of n-type thermoelectric elements and a plurality of p-type thermoelectric elements alternately arranged on one surface of the film in the lengthwise direction of the film, and first electrodes and second electrodes that alternately connect the plurality of n-type thermoelectric elements and the plurality of p-type thermoelectric elements at one side and an opposite side with respect to the width direction of the film to electrically couple the plurality of n-type thermoelectric elements and the plurality of p-type thermoelectric elements in series.

One lateral end and an opposite lateral end of the film are bent with the plurality of n-type thermoelectric elements, the plurality of p-type thermoelectric elements, the first electrodes, and the second electrodes attached to the film, such that the widest surfaces of the first electrodes and the widest surfaces of the second electrodes face the upper surface and the lower surface of the support with respect to the width direction of the film, respectively.

BRIEF DESCRIPTION OF THE FIGURES

The above and other objects, features and advantages of the present disclosure will be more apparent from the following detailed description taken in conjunction with the accompanying drawings.

DETAILED DESCRIPTION

Figure 1:
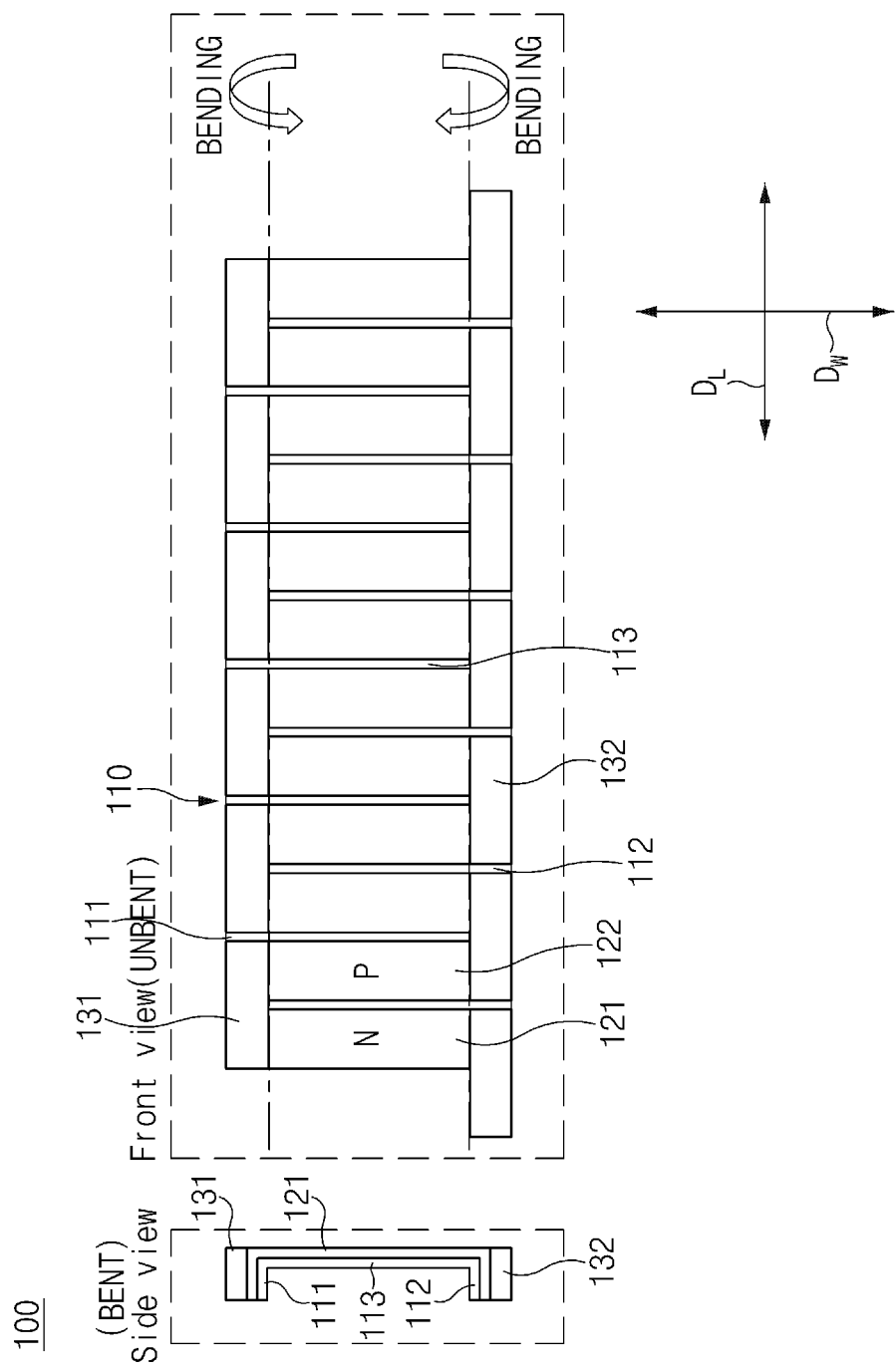
FIG. 1 is a schematic view illustrating a thermoelectric module according to an embodiment of the present disclosure.

Hereinafter, exemplary embodiments of the present disclosure will be described in detail with reference to the accompanying drawings. It should be understood that even if shown in different drawings, identical elements are provided with identical reference numerals in the drawings. Furthermore, in describing the embodiments of the present disclosure, detailed descriptions related to well-known functions or configurations will be omitted when they may make subject matters of the present disclosure unnecessarily obscure.

Terms, such as "first", "second", "A", "B", "(a)", "(b)", and the like, may be used herein to describe elements of the present disclosure. Such terms are only used to distinguish one element from another element, and the substance, sequence, order, or number of these elements is not limited by these terms. If a component were described as "connected", "coupled", or "linked" to another component, they may mean the components are not only directly "connected", "coupled", or "linked" but also are indirectly "connected", "coupled", or "linked" via a third component.

FIG. 1 is a schematic view illustrating a thermoelectric module 100 according to an embodiment of the present disclosure.

The thermoelectric module 100 according to the embodiment of the present disclosure includes a film 110, a plurality of n-type thermoelectric elements 121, a plurality of p-type thermoelectric elements 122, first electrodes 131, and second electrodes 132.

The film 110 is flexible and has an insulation characteristic. The film 110 has a shape that is longer in a lengthwise direction than in a width direction.

The plurality of n-type thermoelectric elements 121 and the plurality of p-type thermoelectric elements 122 are alternately arranged on one surface of the film 110 in the lengthwise direction DL of the film 110.

The first electrodes 131 and the second electrodes 132 alternately connect the plurality of n-type thermoelectric elements 121 and the plurality of p-type thermoelectric elements 122 at one side and an opposite side with respect to the width direction $D_W$ of the film 110 to electrically couple the plurality of n-type thermoelectric elements 121 and the plurality of p-type thermoelectric elements 122 in series.

In general, a thermoelectric module is manufactured by forming n-type and p-type thermoelectric elements and electrodes on a ceramic substrate. However, the thermoelectric elements may be easily separated from the ceramic substrate because the ceramic substrate is very brittle and interfaces between the substrate and the thermoelectric elements are unstable.

To solve this problem, a film type thermoelectric module with thermoelectric elements and electrodes formed on a flexible film is considered in the related art. However, due to the small thickness of the film type thermoelectric module, it is difficult to make a temperature difference, and the film type thermoelectric module has low durability.

The present disclosure relates to an improved film type thermoelectric module for overcoming the shortcomings of the above-described film type thermoelectric module. More specifically, the thermoelectric module 100 according to the embodiment of the present disclosure has a basic feature wherein one lateral end and an opposite lateral end of the film 110 are bent with the plurality of n-type thermoelectric elements 121, the plurality of p-type thermoelectric elements 122, the first electrodes 131, and the second electrodes 132 attached to the film 110, such that the widest surfaces of the first electrodes 131 and the widest surfaces of the second electrodes 132 face the one side and the opposite side with respect to the width direction $D_W$ of the film 110, respectively.

The feature of the thermoelectric module 100 according to the embodiment of the present disclosure will be described below in more detail.

Referring to FIG. 1, the thermoelectric module 100 may be bent at opposite lateral ends thereof with respect to the width direction $D_W$ of the film 110 and may have the shape of "]" when viewed from one side.

Figure 2:
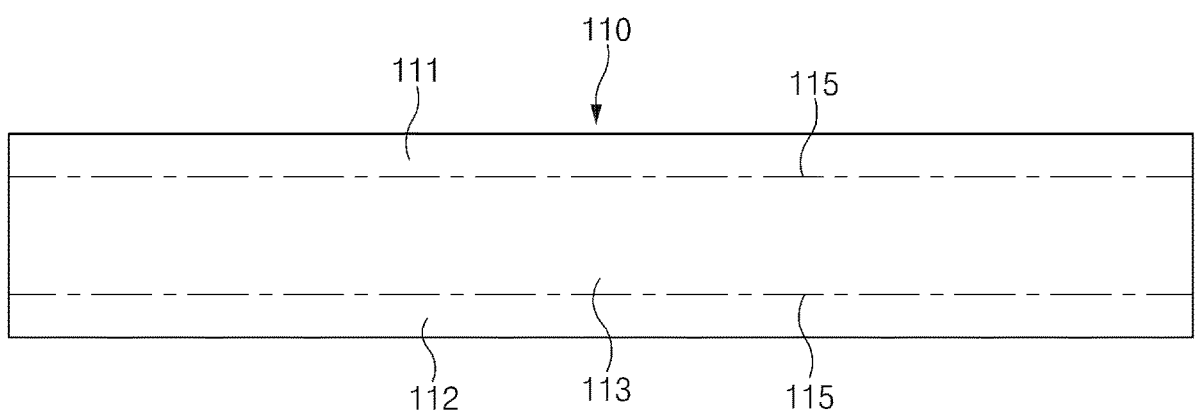
FIG. 2 is a view illustrating a film of the thermoelectric module of FIG. 1.

FIG. 2 is a view illustrating the film 110 of the thermoelectric module 100 of FIG. 1.

Referring to FIG. 2, the film 110 may include a first bending portion 111 at one side, a second bending portion 112 at the opposite side, and a central portion 113 between the first bending portion 111 and the second bending portion 112, with respect to the width direction $D_W$ of the film 110.

The first bending portion 111 may be formed by bending the one lateral end of the film 110, and the first electrodes 131 may be arranged on the first bending portion 111.

The second bending portion 112 may be formed by bending the opposite lateral end of the film 110, and the second electrodes 132 may be arranged on the second bending portion 112.

Both the first bending portion 111 and the second bending portion 112 are bent to a side with respect to a thickness direction of the film 110. That is, the first bending portion 111 and the second bending portion 112 may be formed by bending the opposite lateral ends of the film 110 in a direction from the one surface of the film 110, on which the thermoelectric elements 121 and 122 are arranged, to an opposite surface of the film 110 that is opposite to the one surface.

The central portion 113 extends in the width direction $D_W$ of the film 110 and connects the first bending portion 111 and the second bending portion 112.

The central portion 113 may have a predetermined length with respect to the width direction $D_W$ of the film 110 to maintain a temperature difference between the first electrodes 131 arranged on the first bending portion 111 and the second electrodes 132 arranged on the second bending portion 112.

For example, the central portion 113 may have a width of about 1 mm to about 20 mm. If the central portion 113 has a width of more than 20 mm, the thermoelectric module 100 may be easily damaged due to the brittleness of the thermoelectric elements 121 and 122 formed on the central portion 113. Meanwhile, if the central portion 113 has a width of less than 1 mm, the performance of the thermoelectric module 100 may be degraded due to a small temperature difference between the first electrodes 131 and the second electrodes 132.

In an embodiment, one or more guide grooves 115 may be formed between the first bending portion 111 and the central portion 113 of the film 110 and between the second bending portion 112 and the central portion 113 of the film 110 and may guide bending positions when the film 110 is bent in the state in which the thermoelectric elements 121 and 122 and the electrodes 131 and 132 are formed on the film 110.

Here, the guide grooves 115 may be formed on any one of the one surface of the film 110, on which the thermoelectric elements 121 and 122 and the electrodes 131 and 132 are arranged, and the opposite surface of the film 110 that is opposite to the one surface. For example, the guide grooves 115 may be formed on the one surface or the opposite surface of the film 110 that faces a direction in which the film 110 is bent.

In an embodiment, the film 110 may be formed such that a portion between the first bending portion 111 and the central portion 113 and a portion between the second bending portion 112 and the central portion 113 are thinner than other portions of the film 110.

The film 110 may be formed of a polymer material so as to be flexible and have an insulation characteristic. For example, the film 110 may be formed of at least one of polypropylene (PP) and polyethylene (PE).

The plurality of n-type thermoelectric elements 121 and the plurality of p-type thermoelectric elements 122 may have a predetermined thickness so as to maintain physical properties thereof without being broken when the film 110 is bent. For example, the plurality of n-type thermoelectric elements 121 and the plurality of p-type thermoelectric elements 122 may have a thickness of about 200 μm or less.

In an embodiment, the plurality of n-type thermoelectric elements 121 and the plurality of p-type thermoelectric elements 122 may be printed on the film 110. For example, the plurality of n-type thermoelectric elements 121 and the plurality of p-type thermoelectric elements 122 may be formed by using a screen printing technique.

The first electrodes 131 and the second electrodes 132 may be formed on the one surface of the film 110.

In an embodiment, the first electrodes 131 and the second electrodes 132 may be printed on the film 110. For example, the first electrodes 131 and the second electrodes 132 may be formed by using a screen printing technique.

The first electrodes 131 and the second electrodes 132 may have a thickness of about 0.5 mm or more to effectively transfer electric current and heat.

In an embodiment, lengths of the first electrodes 131 and the second electrodes 131 with respect to the width direction $D_W$ of the film 110 are less than or equal to half the length of the film 110 in the width direction $D_W$ in the state in which the film 110 is unbent. That is, the lengths of the first and second bending portions 111 and 112 may be less than or equal to half the total length of the first and second bending portions 111 and 112 and the central portion 113 of the film 110 with respect to the width direction $D_W$ of the film 110 in the state in which the film 110 is unbent. When the lengths of the first electrodes 131 or the second electrodes 132 in the width direction $D_W$ of the film 110 are greater than or equal to a predetermined length, the heat transfer efficiency of the thermoelectric module 100 may be reduced.

In an embodiment, the thermoelectric elements 121 and 122 and the electrodes 131 and 132 may overlap each other for effective heat transfer between the thermoelectric elements 121 and 122 and the electrodes 131 and 132. That is, the thermoelectric elements 121 and 122 and the electrodes 131 and 132 may be formed such that the widest surfaces of the thermoelectric elements 121 and 122 are in contact with the widest surfaces of the electrodes 131 and 132.

In an embodiment, the thermoelectric elements 121 and 122 and the electrodes 131 and 132 may be formed such that edges of the thermoelectric elements 121 and 122 are in contact with edges of the electrodes 131 and 132.

The thermoelectric elements 121 and 122 may be formed on the film 110 before the electrodes 131 and 132 are formed on the thermoelectric elements 121 and 122, or the electrodes 131 and 132 may be formed on the film 110 before the thermoelectric elements 121 and 122 are formed on the electrodes 131 and 132. In this embodiment, it is exemplified that the thermoelectric elements 121 and 122 are formed on the one surface of the film 110 and then the electrodes 131 and 132 are formed on the thermoelectric elements 121 and 122.

Figure 3:
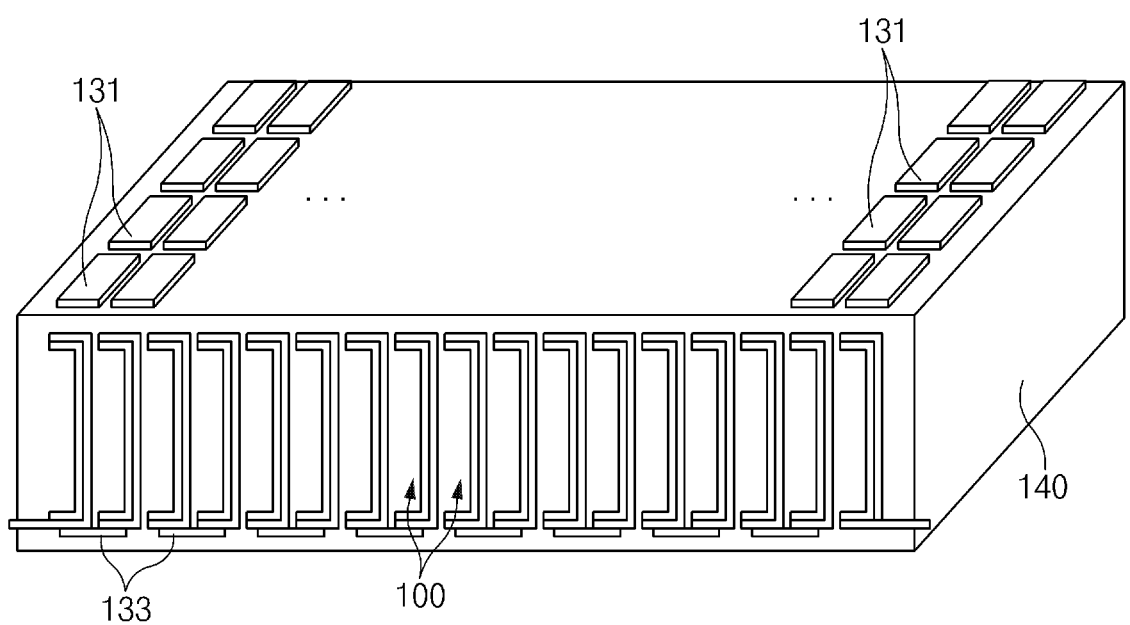
FIG. 3 is a view illustrating a thermoelectric module structure including thermoelectric modules according to an embodiment of the present disclosure.

FIG. 3 is a view illustrating a thermoelectric module structure including thermoelectric modules according to an embodiment of the present disclosure.

A thermoelectric module structure having a plurality of thermoelectric modules 100 inserted into a support 140 may be considered.

The support 140 may be formed of an elastic material, and therefore the thermoelectric module structure may have flexibility and may be structurally stably maintained.

The support 140 may be formed of a polymer. For example, the support 140 may be formed of polydimethylsiloxane (PDMS).

In an embodiment, the thermoelectric module structure may be formed by arranging the plurality of thermoelectric modules 100 in one direction and filling the spaces between the thermoelectric modules 100 with an elastic material.

The plurality of thermoelectric modules 100 may be arranged in a thickness direction with predetermined spacing therebetween.

The plurality of thermoelectric modules 100 may be inserted into the support 140 such that lengthwise directions of the plurality of thermoelectric modules 100 are parallel to each other. The lengthwise directions of the thermoelectric modules 100 may be defined to be the same as the lengthwise direction DL of the film 110.

The plurality of thermoelectric modules 100 may be electrically coupled together by third electrodes 133. The third electrodes 133 may couple, at one side, the plurality of thermoelectric modules 100 arranged in the one direction.

The thermoelectric modules 100 electrically coupled together may include a positive (+) electrode and a negative (−) electrode on end portions connected by the third electrode 133 and may receive electric power from the outside or may provide produced electricity to the outside.

The film 110, the plurality of n-type thermoelectric elements 121, and the plurality of p-type thermoelectric elements 122 may be inserted into the support 140, and the first electrodes 131 and/or the second electrodes 132 may be exposed outside the support 140. The electrodes exposed outside the support 140 may effectively receive heat from the outside, or may effectively reject heat to the outside.

The above-configured thermoelectric modules 100 may have flexibility and a structurally stable form. Accordingly, the thermoelectric modules 100 may be applicable to various fields.

Hereinafter, a temperature modulating apparatus including thermoelectric modules according to an embodiment of the present disclosure will be described.

Figure 4:
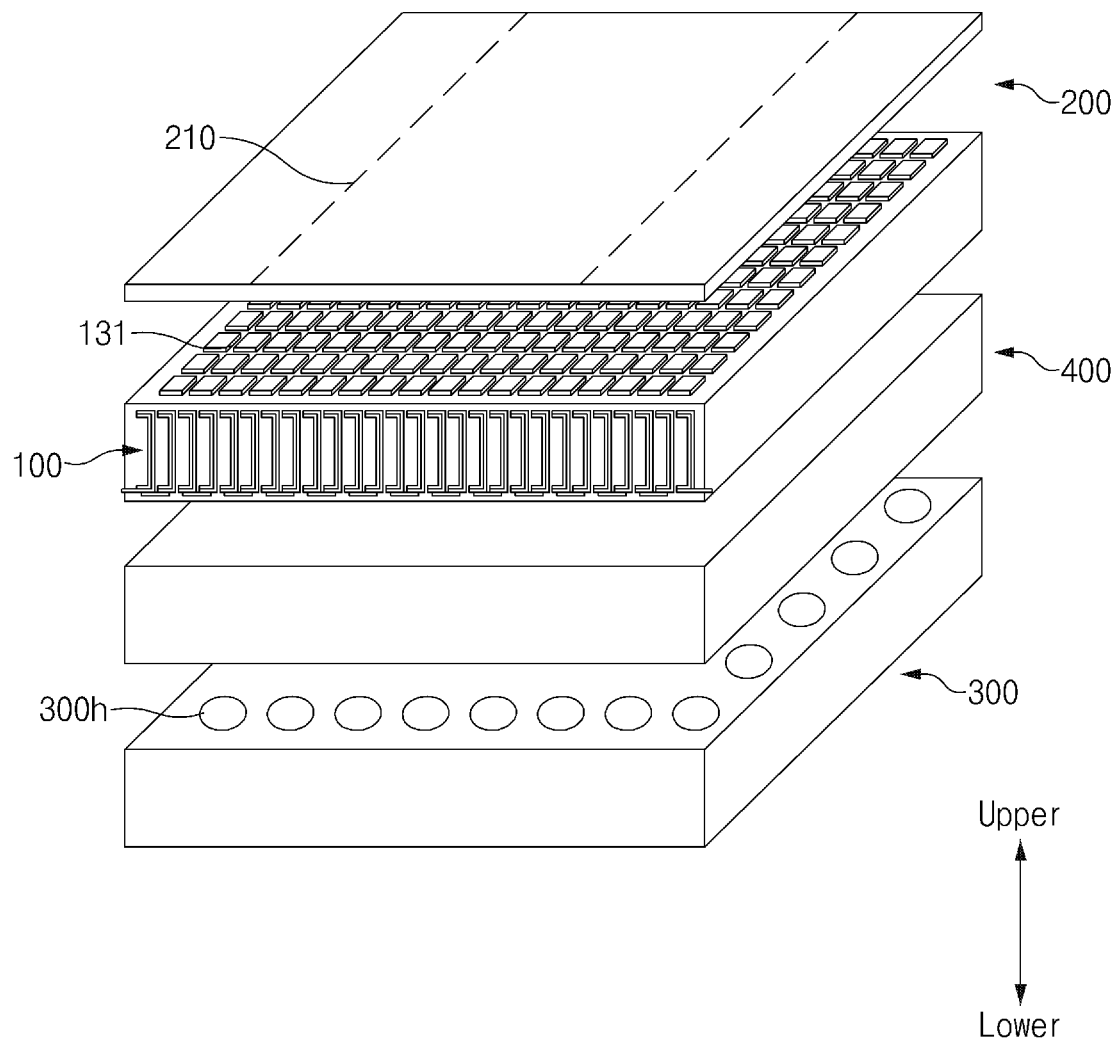
FIG. 4 is a schematic view illustrating a temperature modulating apparatus including thermoelectric modules according to an embodiment of the present disclosure.
Figure 5:
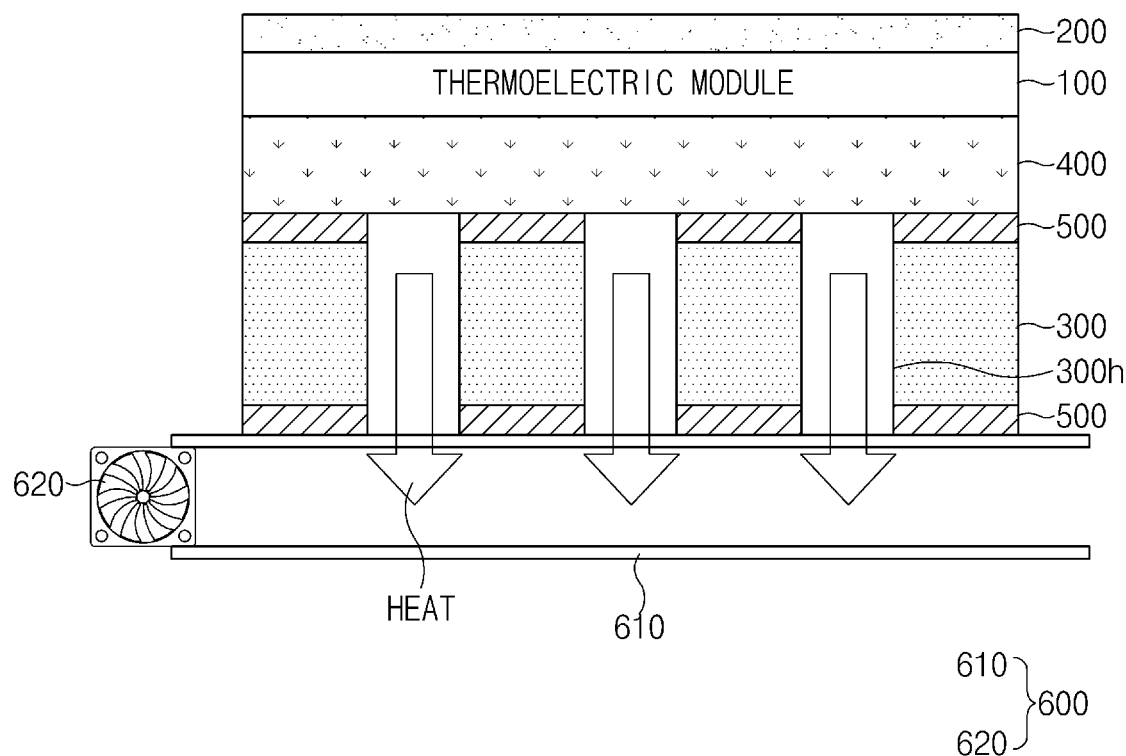
FIG. 5 is another schematic view illustrating a temperature modulating apparatus including thermoelectric modules according to an embodiment of the present disclosure.

FIGS. 4 and 5 are schematic views illustrating the temperature modulating apparatus including the thermoelectric modules according to the embodiment of the present disclosure.

According to the embodiment of the present disclosure, the temperature modulating apparatus includes a cover layer 200, the support 140 with an insulation characteristic into which the thermoelectric modules 100 are inserted, and heat dissipation foam 300.

The cover layer 200 is exposed to the outside and covers an upper surface of the support 140.

The support 140 adheres to the cover layer 200 on the upper surface thereof and has the thermoelectric modules 100 therein. The support 140 may correspond to the above-described thermoelectric module structure.

The heat dissipation foam 300 adheres to a lower surface of the support 140. The heat dissipation foam 300 may be formed of a material with higher thermal conductivity than the support 140 and may effectively dissipate heat transferred from the support 140, to the outside.

Although the film 110, the plurality of n-type thermoelectric elements 121, and the plurality of p-type thermoelectric elements 122 are inserted into the support 140, the first electrodes 131 and the second electrodes 132 are exposed to the outside through the upper surface and the lower surface of the support 140, respectively. Accordingly, heat may be effectively exchanged between the first electrodes 131 and the cover layer 200 and between the second electrodes 132 and the heat dissipation foam 300.

The heat dissipation foam 300 may have through-holes 300h formed through an upper surface and a lower surface of the heat dissipation foam 300, wherein the upper surface is adjacent to the support 140 and the lower surface is opposite to the upper surface. Accordingly, the heat dissipation foam 300 may allow heat of the second electrodes 132 to be effectively dissipated.

The temperature modulating apparatus may further include a phase change material (PCM) layer 400 disposed between the support 140 and the heat dissipation foam 300.

As generally known, a phase change material (PCM) is the general term for materials that are capable of storing cold/hot-heat using latent heat when the materials experience a phase change. The PCM refers to a latent heat material, a heat storage material, or a material having a heat modulating function that is capable of absorbing or releasing a large amount of heat when changing from solid to liquid and vice versa or from gas to liquid at specific temperature. The PCM is a temperature modulating material that stores ambient heat by itself and discharges the heat when necessary. Various materials well known in the related art may be used as a PCM constituting the PCM layer 400.

In an embodiment, the PCM layer 400 may be manufactured in a silica gel structure. For example, the PCM layer 400 may be manufactured through capsulation of a phase change material.

The temperature modulating apparatus may further include a separate heat dissipation member 600 to more effectively discharge heat from one side of each thermoelectric module 100.

The heat dissipation member 600 may include a heat dissipation duct 610 installed in contact with the lower surface of the heat dissipation foam 300 that is opposite to the upper surface adjacent to the support 140.

The heat dissipation duct 610 may be provided in contact with the heat dissipation foam 300 and may be provided in contact with the PCM layer 400 for dissipating heat from the heat dissipation foam 300. No special limitation applies to the position of the heat dissipation duct 610, as long as the heat dissipation duct 610 is capable of performing a function of discharging heat from the second electrodes 132 of the thermoelectric module 100.

In an embodiment, the heat dissipation duct 610 may be formed of a high-conductive metallic material. For example, the heat dissipation duct 610 may be formed of aluminum.

In an embodiment, the heat dissipation duct 610 may have a solid form.

In an embodiment, the heat dissipation duct 610 may have a hollow pipe form.

The temperature modulating apparatus may further include a heat dissipation fan 620 for providing forced air flow in the heat dissipation duct 610. The heat dissipation fan 620 may be provided together with the heat dissipation duct 610 in a hollow pipe form and may force air flow in the heat dissipation duct 610, thereby improving a heat dissipation effect.

The temperature modulating apparatus may further include an adhesive layer 500 between the PCM layer 400 and the heat dissipation foam 300 and between the heat dissipation foam 300 and the heat dissipation duct 610. The adhesive layer 500 may increase the heat transfer rate at the interface between the layers of the temperature modulating apparatus. Furthermore, the adhesive layer 500 may be used to bond the layers of the temperature modulating apparatus. The adhesive layer 500 may be formed of a high-conductive material among various adhesive materials in the related art.

According to the embodiments of the present disclosure, at least the following effects are achieved.

First, the thermoelectric module according to the present disclosure achieves an improvement in flexibility, compared with the conventional thermoelectric module including the ceramic substrate. Accordingly, the thermoelectric module according to the present disclosure is applicable to various areas such as a position where a surface has a curvature.

Second, the thermoelectric module according to the present disclosure may prevent materials adhering to each other from being easily separated and may be structurally stably maintained, compared with the conventional thermoelectric module including the ceramic substrate, wherein materials adhering to each other are easily separated by impacts.

Third, the present disclosure may provide the temperature modulating apparatus including the thermoelectric module having the characteristics mentioned above.

Effects of the present disclosure are not limited to the aforementioned effects, and any other effects not mentioned herein will be clearly understood from the accompanying claims by those skilled in the art to which the present disclosure pertains.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

The invention claimed is:

1. A thermoelectric module comprising:
a flexible film with an insulation characteristic, the film having a shape that is longer in a lengthwise direction than in a width direction;
a plurality of n-type thermoelectric elements and a plurality of p-type thermoelectric elements alternately arranged on a same surface of the film in the lengthwise direction of the film; and
first electrodes and second electrodes configured to alternately connect the plurality of n-type thermoelectric elements and the plurality of p-type thermoelectric elements at one side and an opposite side with respect to the width direction of the film in the lengthwise direction of the film to electrically connect the plurality of n-type thermoelectric elements and the plurality of p-type thermoelectric elements in series,
wherein one lateral end and an opposite lateral end of the film with respect to the width direction of the film are bent with the plurality of n-type thermoelectric elements, the plurality of p-type thermoelectric elements, the first electrodes, and the second electrodes attached to the film, wherein the film includes:
a central portion extending in the width direction of the film;
a first bending portion bent in a thickness direction of the central portion at one end of the central portion with respect to the width direction; and
a second bending portion bent in the thickness direction at an opposite end of the central portion with respect to the width direction and forming a U-shape facing the thickness direction together with the central portion and the first bending portion;

wherein each of the plurality of n-type thermoelectric elements and the plurality of p-type thermoelectric elements includes:
a center portion positioned on the central portion of the film;
a first portion bent in the thickness direction at one end of the center portion with respect to the width direction and positioned on the first bending portion of the film; and
a second portion bent in the thickness direction at an opposite end of the center portion with respect to the width direction and positioned on the second bending portion of the film and forming a U-shape facing the same direction as the U-shape of the film together with the center portion and the first portion;

wherein each of the first electrodes connects the first portion of one of the plurality of n-type thermoelectric elements and the first portion of one of the plurality of p-type thermoelectric elements; and wherein each of the second electrodes connects the second portion of one of the plurality of n-type thermoelectric elements and the second portion of one of the plurality of p-type thermoelectric elements.

2. The thermoelectric module of claim 1,
wherein one or more guide grooves are formed between the first bending portion and the central portion and between the second bending portion and the central portion to guide positions where the film is bent.

3. The thermoelectric module of claim 1, wherein the plurality of n-type thermoelectric elements and the plurality of p-type thermoelectric elements have a predetermined thickness so as not to be broken when the film is bent, with the plurality of n-type thermoelectric elements and the plurality of p-type thermoelectric elements attached to the film.

4. The thermoelectric module of claim 1, wherein the first and second electrodes are thicker than the plurality of n-type and p-type thermoelectric elements.

5. The thermoelectric module of claim 1, wherein, based on the width direction of the film, lengths of the first electrodes are less than or equal to half a length of the film respectively and lengths of the second electrodes are less than or equal to half a length of the film respectively, prior to the bending of the film.

6. The thermoelectric module of claim 1, wherein the film includes a polymer material.

7. The thermoelectric module of claim 1, further comprising:
a support having an insulation characteristic to support the film,
wherein the film, the plurality of n-type thermoelectric elements, and the plurality of p-type thermoelectric elements are inserted into the support, and the first electrodes and/or the second electrodes are exposed outside the support.

8. A temperature modulating apparatus including a thermoelectric module, the temperature modulating apparatus comprising:
a cover layer exposed to the outside;
a support with an insulation characteristic, wherein the support has an upper surface adhering to the cover layer, and the thermoelectric module is inserted into the support; and
a heat dissipation foam adhering to a lower surface of the support, the heat dissipation foam being formed of a material with higher thermal conductivity than the support, wherein the thermoelectric module includes:
a flexible film with an insulation characteristic, the film having a shape that has a width in a direction in which the cover layer, the support, and the heat dissipation foam are stacked and is longer in a lengthwise direction than in the width direction;
a plurality of n-type thermoelectric elements and a plurality of p-type thermoelectric elements alternately arranged on a same surface of the film in the lengthwise direction of the film; and
first electrodes and second electrodes configured to alternately connect the plurality of n-type thermoelectric elements and the plurality of p-type thermoelectric elements at one side and an opposite side with respect to the width direction of the film in the lengthwise direction of the film to electrically connect the plurality of n-type thermoelectric elements and the plurality of p-type thermoelectric elements in series, and wherein one lateral end and an opposite lateral end of the film with respect to the width direction of the film are bent with the plurality of n-type thermoelectric elements, the plurality of p-type thermoelectric elements, the first electrodes, and the second electrodes attached to the film wherein the film includes:
a central portion extending in the width direction of the film;
a first bending portion bent in a thickness direction of the central portion at one end of the central portion with respect to the width direction; and
a second bending portion bent in the thickness direction at an opposite end of the central portion with respect to the width direction and forming a U-shape facing the thickness direction together with the central portion and the first bending portion;

wherein each of the plurality of n-type thermoelectric elements and the plurality of p-type thermoelectric elements includes:
a center portion positioned on the central portion of the film;
a first portion bent in the thickness direction at one end of the center portion with respect to the width direction and positioned on the first bending portion of the film; and
a second portion bent in the thickness direction at an opposite end of the center portion with respect to the width direction and positioned on the second bending portion of the film and forming a U-shape facing a same direction as the U-shape of the film together with the central portion and the first portion, wherein each of the first electrodes connects the first portion of one of the plurality of n-type thermoelectric elements and the first portion of one of the plurality of p-type thermoelectric elements; and wherein each of the second electrodes connects the second portion of one of the plurality of n-type thermoelectric elements and the second portion of one of the plurality of p-type thermoelectric elements.

9. The temperature modulating apparatus of claim 8, wherein the film, the plurality of n-type thermoelectric elements, and the plurality of p-type thermoelectric elements are inserted into the support, the first electrodes are exposed to the outside through the upper surface of the support, and the second electrodes are exposed to the outside through the lower surface of the support.

10. The temperature modulating apparatus of claim 8, wherein the thermoelectric module include a plurality of thermoelectric modules,
   wherein the plurality of thermoelectric modules are inserted into the support such that lengthwise directions of the plurality of thermoelectric modules are parallel to each other, and
   wherein the temperature modulating apparatus further includes third electrodes configured to connect second electrodes of the plurality of thermoelectric modules to electrically connect the plurality of thermoelectric modules in series.

11. The temperature modulating apparatus of claim 8, wherein the heat dissipation foam has through-holes formed through an upper surface and a lower surface of the heat dissipation foam to dissipate heat from the second electrodes, the upper surface of the heat dissipation foam being adjacent to the support and the lower surface of the heat dissipation foam being opposite to the upper surface of the heat dissipation foam.

12. The temperature modulating apparatus of claim 8, further comprising:
   a phase change material (PCM) layer disposed between the support and the heat dissipation foam to dissipate heat from the second electrodes.

13. The temperature modulating apparatus of claim 8, further comprising:
   a heat dissipation duct installed in contact with a lower surface of the heat dissipation foam to dissipate heat from the heat dissipation foam, wherein the heat dissipation foam has an upper surface adjacent to the support and the lower surface opposite to the upper surface; and
   a heat dissipation fan configured to force air flow in the heat dissipation duct.

14. The temperature modulating apparatus of claim 8, further comprising:
   a fastening structure configured to combine the cover layer and the support together,
   wherein the fastening structure combines the cover layer and an area of the support where the thermoelectric module is not located.

* * * * *